US012693354B2

(12) United States Patent
Wynn et al.

(10) Patent No.: US 12,693,354 B2
(45) Date of Patent: Jul. 28, 2026

(54) RADIO FREQUENCY RECEIVER ARRAY COIL FOR MAGNETIC RESONANCE IMAGING SYSTEM, METHOD OF USE OF THE COIL, AND MRI SYSTEM COMPRISING THE COIL

(71) Applicant: KONINKLIJKE PHILIPS N.V., Eindhoven (NL)

(72) Inventors: Tracy Allyn Wynn, Gainsville, FL (US); Scott Bradley King, Gainsville, FL (US); Alton Keel, Gainsville, FL (US); Timothy Caine Ortiz, Alachua, FL (US); Arne Reykowski, Newberry, FL (US); Paul Franz Redder, Newberry, FL (US); Olli Tapio Friman, Eindhoven (NL); Rodrigo Canderon Rico, Newberry, FL (US)

(73) Assignee: Koninklijke Philips N.V., Eindhoven (NL)

( * ) Notice: Subject to any disclaimer, the term of this patent is extended or adjusted under 35 U.S.C. 154(b) by 194 days.

(21) Appl. No.: 18/576,383

(22) PCT Filed: Jul. 4, 2022

(86) PCT No.: PCT/EP2022/068382
§ 371 (c)(1),
(2) Date: Jan. 4, 2024

(87) PCT Pub. No.: WO2023/280747
PCT Pub. Date: Jan. 12, 2023

(65) Prior Publication Data
US 2024/0319294 A1 Sep. 26, 2024

Related U.S. Application Data

(60) Provisional application No. 63/218,642, filed on Jul. 6, 2021.

(51) Int. Cl.
*G01R 33/28* (2006.01)
*G01R 33/385* (2006.01)

(52) U.S. Cl.
CPC ......... *G01R 33/288* (2013.01); *G01R 33/385* (2013.01)

(58) Field of Classification Search
CPC . G01R 33/288; G01R 33/385; G01R 33/3657
See application file for complete search history.

(56) References Cited

U.S. PATENT DOCUMENTS

2007/0262775 A1 11/2007 Lee et al.
2011/0163749 A1 7/2011 Katscher et al.
(Continued)

FOREIGN PATENT DOCUMENTS

EP 3796019 A1 * 3/2021 ........... G01R 33/583

OTHER PUBLICATIONS

International Search Report and Written Opinion from PCT/EP2022/068382 mailed Oct. 25, 2022.

*Primary Examiner* — Daniel R Miller

(57) ABSTRACT

A device receives during an RF receive cycle a magnetic resonance signal (250) from an area of interest of a patient (20) which is generated in response to a RF transmit signal (350) of an MRI system (100) during an RF transmit cycle. The device includes: an RF receive coil (301); a detector (330); and a first coupling (840) device adapted to couple to an input of the detector (330) a signal (350) which is proportional to a current flowing through the RF receive coil (301) during the RF transmit cycle. The detector (330) outputs a signal (350), which indicates the magnitude and/or phase of the current flowing through the RF receive coil (301) during the RF transmit cycle. The digital signal (350) may be used to stop MR scanning, and/or to notify a system (100) operator, before harm can occur to the patient (20) due (Continued)

to excessive current in the RF receive coil (301) during the
RF transmit cycle.

19 Claims, 8 Drawing Sheets

(56)                    References Cited

U.S. PATENT DOCUMENTS

| | | |
|---|---|---|
| 2012/0086449 A1 | 4/2012 | Graesslin et al. |
| 2013/0147484 A1 | 6/2013 | Shah et al. |
| 2014/0139218 A1 | 5/2014 | Findeklee et al. |
| 2014/0225613 A1 | 8/2014 | Reykowski |
| 2016/0033591 A1 | 2/2016 | Leussler et al. |
| 2017/0199256 A1 | 7/2017 | Verghese |
| 2018/0011155 A1 | 1/2018 | Ito |
| 2018/0321339 A1 | 11/2018 | Yang et al. |
| 2020/0191890 A1* | 6/2020 | Nistler ............... G01R 33/3692 |
| 2021/0190890 A1* | 6/2021 | Biber ................. G01R 33/3628 |

* cited by examiner

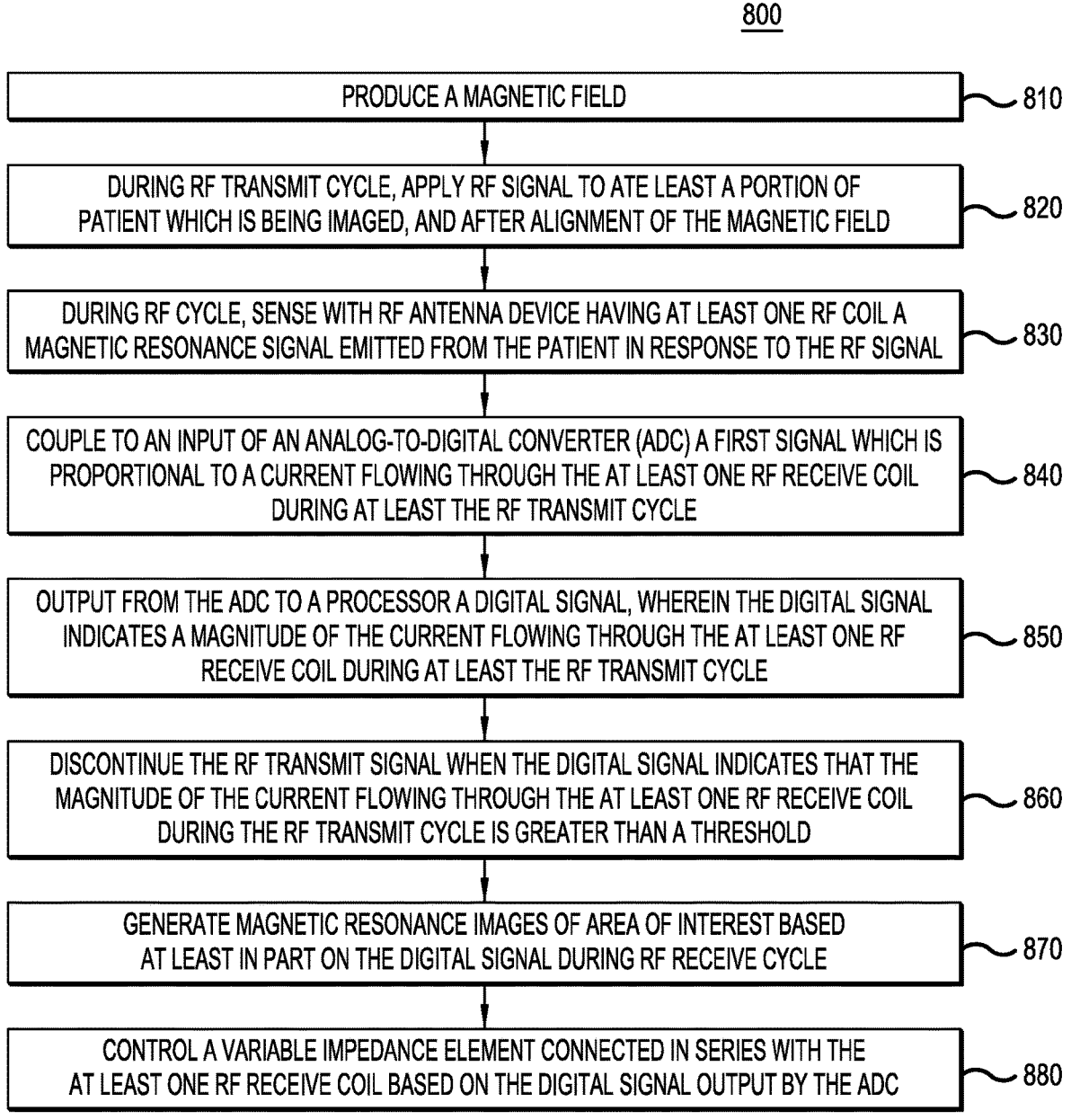

800

PRODUCE A MAGNETIC FIELD — 810

DURING RF TRANSMIT CYCLE, APPLY RF SIGNAL TO ATE LEAST A PORTION OF PATIENT WHICH IS BEING IMAGED, AND AFTER ALIGNMENT OF THE MAGNETIC FIELD — 820

DURING RF CYCLE, SENSE WITH RF ANTENNA DEVICE HAVING AT LEAST ONE RF COIL A MAGNETIC RESONANCE SIGNAL EMITTED FROM THE PATIENT IN RESPONSE TO THE RF SIGNAL — 830

COUPLE TO AN INPUT OF AN ANALOG-TO-DIGITAL CONVERTER (ADC) A FIRST SIGNAL WHICH IS PROPORTIONAL TO A CURRENT FLOWING THROUGH THE AT LEAST ONE RF RECEIVE COIL DURING AT LEAST THE RF TRANSMIT CYCLE — 840

OUTPUT FROM THE ADC TO A PROCESSOR A DIGITAL SIGNAL, WHEREIN THE DIGITAL SIGNAL INDICATES A MAGNITUDE OF THE CURRENT FLOWING THROUGH THE AT LEAST ONE RF RECEIVE COIL DURING AT LEAST THE RF TRANSMIT CYCLE — 850

DISCONTINUE THE RF TRANSMIT SIGNAL WHEN THE DIGITAL SIGNAL INDICATES THAT THE MAGNITUDE OF THE CURRENT FLOWING THROUGH THE AT LEAST ONE RF RECEIVE COIL DURING THE RF TRANSMIT CYCLE IS GREATER THAN A THRESHOLD — 860

GENERATE MAGNETIC RESONANCE IMAGES OF AREA OF INTEREST BASED AT LEAST IN PART ON THE DIGITAL SIGNAL DURING RF RECEIVE CYCLE — 870

CONTROL A VARIABLE IMPEDANCE ELEMENT CONNECTED IN SERIES WITH THE AT LEAST ONE RF RECEIVE COIL BASED ON THE DIGITAL SIGNAL OUTPUT BY THE ADC — 880

FIG.8

RADIO FREQUENCY RECEIVER ARRAY COIL FOR MAGNETIC RESONANCE IMAGING SYSTEM, METHOD OF USE OF THE COIL, AND MRI SYSTEM COMPRISING THE COIL

CROSS REFERENCE TO RELATED APPLICATIONS

This application is a U.S. national phase application of International Application No. PCT/EP2022/068382 filed on Jul. 4, 2022, which claims the benefit of U.S. Application Ser. No. 63/218,642 filed on Jul. 6, 2021 and is incorporated herein by reference.

TECHNICAL FIELD

The present system generally relates to magnetic resonance imaging (MRI) systems with a radio frequency (RF) receive array coil comprising one or more RF coil elements or loops, and methods of operation thereof.

BACKGROUND

Many MRI systems use one or more RF receive antenna devices to sense magnetic resonance (MR) signals emitted from one or more areas of interest in a subject or patient under MRI examination in order to reconstruct images of the area(s) of interest. These RF receive antenna devices generally include one or more RF receive coils or loops.

These RF receive coils are used in an environment of a high-magnitude RF magnetic field, commonly referred to as the $B_1$ field. This field naturally induces currents into the RF receive coil(s) used for reception of the MR signal, and if these currents are not controlled then the RF receive coil(s) may distort the homogeneity of the $B_1$ field, and more importantly, the high-intensity local magnetic fields from these induced currents may harm the patient.

SUMMARY

Accordingly, it would be desirable to provide an RF receive antenna device for a magnetic resonance imaging (MRI) system which includes a means for preventing high-intensity local magnetic fields from induced currents in one or more RF receive array coil from causing harm to the patient. In particular, it would be desirable to provide a means and a method to measure the loop current in an RF receive array coil of an RF receive antenna device directly and provide a signal which can notify a controller and/or operator of the MRI system when induced currents exceed safe limits.

As disclosed herein an MRI system comprises: a magnet configured to produce a magnetic field that then generates a net nuclear magnetization within a patient that is placed within the magnetic field; gradient coils configured to at least partially surround at least a portion of the patient which is being imaged; a radio frequency (RF) transmit coil unit configured to apply a transmit RF magnetic field during an RF transmit cycle to at least the portion of a patient and to perturb an alignment of the magnetization with respect to the magnetic field in the portion of the patient; and at least one RF receive antenna device configured to be positioned adjacent to an area of interest of the patient and to receive during an RF receive cycle a magnetic resonance signal from the area of interest of the patient which is generated in response to the transmit RF magnetic field. The at least one RF receive antenna device comprises: at least one RF receive coil array, detector, and a first coupling device adapted to connect to an input of the detector a signal, which is proportional to a current flowing through the at least one RF receive coil during at least the RF transmit cycle. The MRI system comprises a main controller, and the detector has a signal as an output coupled to the main controller to provide to the main controller. The signal indicates a magnitude and/or phase and/or phase of the current flowing through the at least one RF receive coil during at least the RF transmit cycle.

As also disclosed herein, a method comprises: producing a RF magnetic field; during a radio frequency (RF) transmit cycle applying an transmit RF magnetic field to at least a portion of a patient which is being imaged, and perturbing an alignment of the magnetization with respect to the magnetic field; sensing with an RF receive antenna device having at least one RF receive coil a magnetic resonance signal emitted from an area of interest of the patient during an RF receive cycle in response to the transmit RF magnetic field; coupling to an input of an detector a first signal which is proportional to a current flowing through the at least one RF receive coil during at least the RF transmit cycle; outputting from the detector to a processor a digital signal, wherein the digital signal indicates a magnitude and/or phase of the current flowing through the at least one RF receive coil during at least the RF transmit cycle; and discontinuing the transmit RF magnetic field when the digital signal indicates that the magnitude and/or phase of the current flowing through the at least one RF receive coil during the RF transmit cycle is greater than a threshold.

As further disclosed herein, a device is configured to receive during a radio frequency (RF) receive cycle a magnetic resonance signal from an area of interest of a patient. The magnetic resonance signal is generated in response to a transmit RF magnetic field during an RF transmit cycle of a magnetic resonance imaging (MRI) system. The device comprises: at least one RF receive coil element; a first coupling device adapted to couple to an input of a detector a signal that is proportional to a current flowing through the at least one RF receive coil element during at least the RF transmit cycle. The detector has an output for providing a signal (350, 650b) that indicates a magnitude and/or phase of the current flowing through the at least one RF receive coil element during at least the RF transmit cycle.

BRIEF DESCRIPTION OF THE DRAWINGS

The present invention will be more readily understood from the detailed description of exemplary embodiments presented below considered in conjunction with the accompanying drawings.

FIG. 8 illustrates an example embodiment of a method of operation of an MRI system which includes one or more RF receive antenna devices which may directly sample, measure, and digitize the current though an RF receive array coil during an RF transmit cycle.

DETAILED DESCRIPTION

Figure 1:
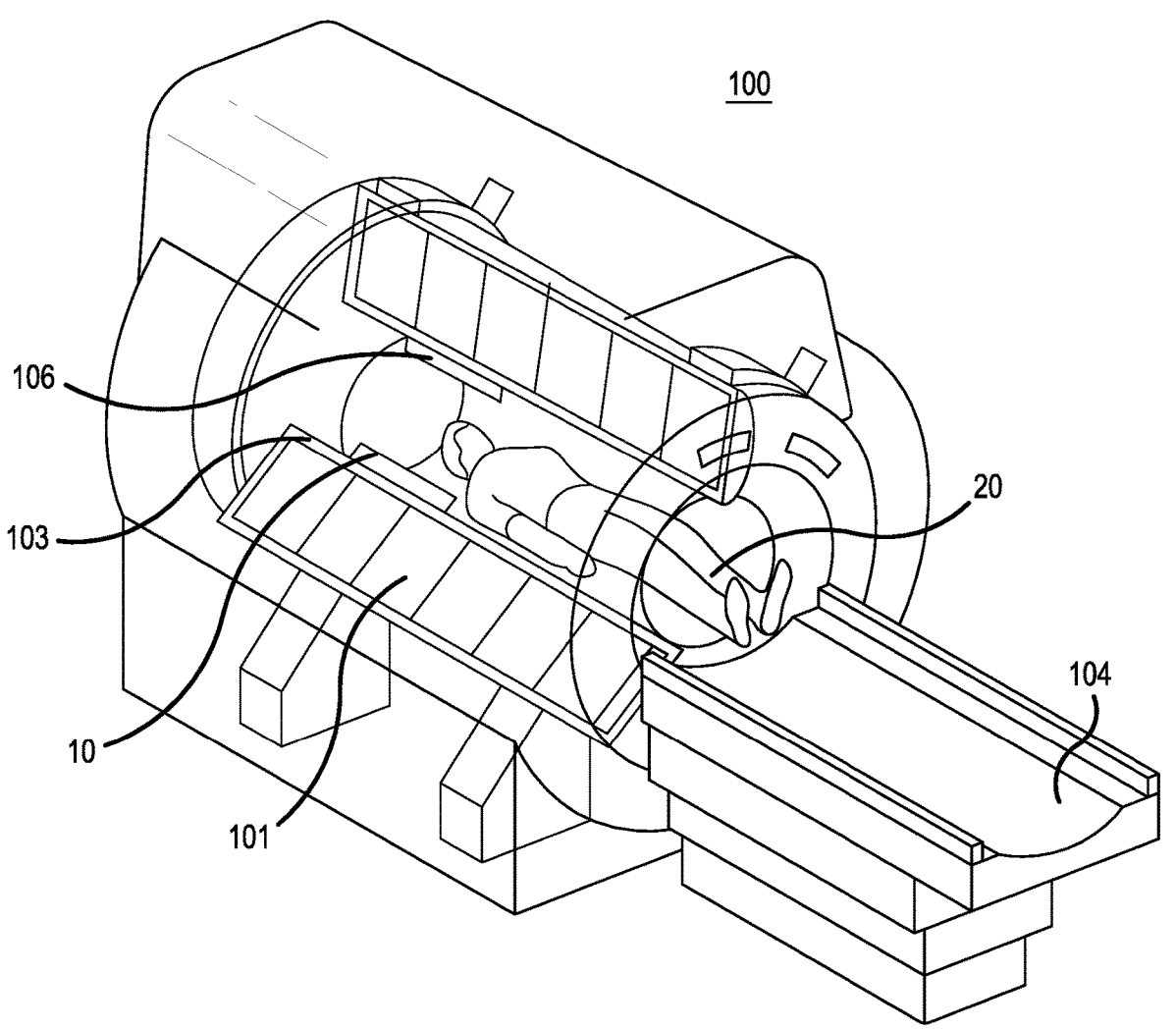
FIG. 1 illustrates an exemplary embodiment of a magnetic resonance imaging (MRI) system.

In the following detailed description, for the purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the inventive concept.

The terminology used herein is for purposes of describing particular embodiments only and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

Unless noted herein to the contrary, as used herein the term "coil" comprises one or more RF coil elements or loops and may be referred to as an RF array coil.

FIG. 1 illustrates an exemplary embodiment of a magnetic resonance imaging (MRI) system 100. MRI system 100 includes a magnet system 101; a patient table 104 configured to hold a subject or patient 20; gradient coils 103 configured to at least partially surround at least a portion of patient 20 for which MRI system 100 generates an image; and a radio frequency coil 106 configured to apply a transmit RF magnetic field to at least the portion of a subject or patient 20 which is being imaged, and to perturb the alignment of the magnetization with respect to the magnetic field; and one or more sensors 10 configured to detect changes in the magnetization caused by the transmit RF magnetic field and patient 20.

Figure 2:
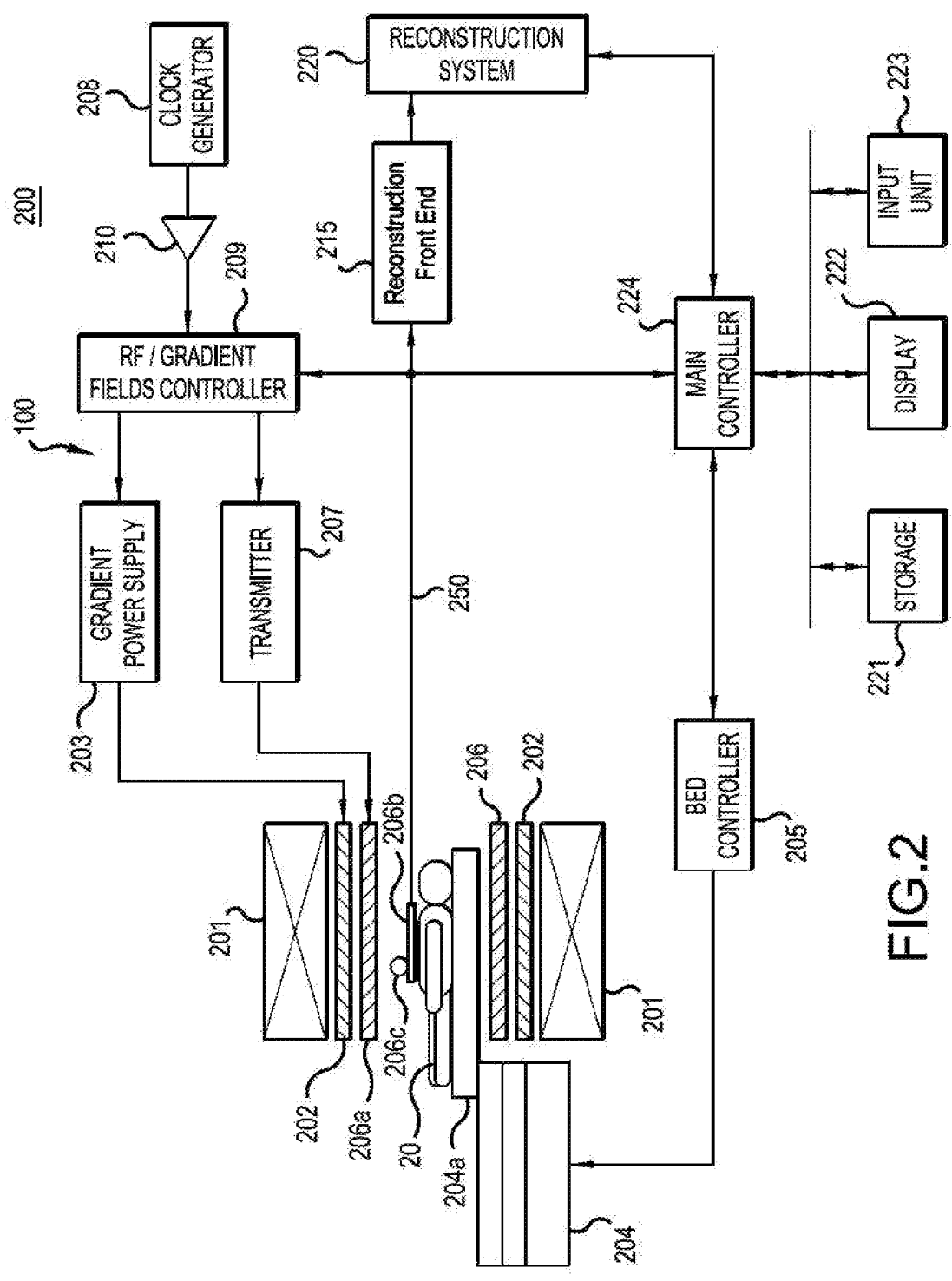
FIG. 2 is a block diagram of an exemplary embodiment of an MRI system employing at least one RF receive antenna device, as described in greater detail below.

FIG. 2 is a block diagram of an exemplary embodiment of an MRI system 200 employing at least one RF receive antenna device, as described in greater detail below.

MRI system 200 includes a static field magnet 201, a gradient magnetic field coil 202, a gradient power supply 203, a patient table or bed 204, a patient table (or bed) controller 205, RF transmit coil unit 206a, one or more RF receive antenna device(s) 206b, each including one or more RF receive coils 206c, a transmitter 207, a clock generator 208, an RF/gradient fields controller 209, a driver 210, a reconstruction front end 215, a reconstruction system 220, a storage device 221, a display 222, an input unit 223, a main controller 224 and a data generator 225.

The main unit may be divided into a gantry and a processing system. In this case, for example, static field magnet 201, gradient magnetic field coil 202, gradient power supply 203, patient table 204, patient table controller 205, RF transmit coil unit 206a, transmitter 207, and RF/gradient fields controller 209 may be provided in the gantry, while clock generator 208, driver 210, reconstruction front end 215, reconstruction system 220, storage device 221, display 222, input unit 223 and main controller 224 may be provided in the processing system.

Static field magnet 201 has a hollow cylindrical shape, and generates a uniform static magnetic field in its internal space. For example, a permanent magnet or superconducting magnet is used as static field magnet 201.

Gradient magnetic field coil 202 has a hollow cylindrical shape, and is disposed inside static field magnet 201. Gradient magnetic field coil 202 may include a combination of three kinds of coils corresponding to X, Y, Z axes which are orthogonal to one another. Gradient magnetic field coil 202 generates a gradient magnetic field having its intensity inclined along the X, Y, Z axes when the three kinds of coils are separately supplied with currents from gradient power supply 203. In addition, the Z axis is in the same direction as, for example, the direction of the static magnetic field. The gradient magnetic fields of the X, Y, and Z axes correspond to, for example, a slice selecting gradient magnetic field Gs, a phase encoding gradient magnetic field Ge and a read-out gradient magnetic field Gr, respectively. The slice selecting gradient magnetic field Gs is used to determine a given imaging section. The phase encoding gradient magnetic field Ge is used to change the phase of a magnetic resonance signal in accordance with a spatial position. The read-out gradient magnetic field Gr is used to change the frequency of the magnetic resonance signal in accordance with the spatial position.

RF transmit coil unit 206a includes one or more coils contained in a cylindrical case. RF transmit coil unit 206a may be disposed inside gradient magnetic field coil 202. RF transmit coil unit 206a is supplied by transmitter 207 with a high-frequency pulse (RF pulse) corresponding to a Larmor frequency to generate a high-frequency magnetic field. RF transmit coil unit 206a is configured to apply a transmit RF magnetic field during an RF transmit cycle to at least a portion of patient 20, including one or more areas of interest, and to perturb an alignment of the magnetic field in the portion of patient 20 for producing, in conjunction with RF receive antenna device(s) 206b, MR image data of the area(s) of interest.

Notably, "to perturb" as used herein includes the use of transmit pulses to either excite/create a signal for the receive coil to acquire; or the use of transmit pulses to refocus magnetization so the signal is available at a later time; or the use of transmit pulses to saturate or suppress the signal to nullity. Often such perturbation is carried out over a specific band of frequencies.

Patient 20 is inserted into an internal space (imaging space) of gradient magnetic field coil 202 while being mounted on a top board 204a of patient table 204. Patient table 204 moves top board 204a in its longitudinal direction (right-and-left direction in FIG. 2) and vertical direction under the control of patient table controller 205. Normally, patient table 204 is installed so that this longitudinal direction is parallel with the central axis of static field magnet 201.

RF receive antenna device 206b may be mounted on top board 204a, embedded in top board 204a, or placed on or attached to patient 20. At the time of imaging, RF receive antenna device 206b is inserted into the imaging space together with patient 20, and receives or senses the magnetic resonance signal emitted from patient 20 as electromagnetic waves in response to the transmit RF magnetic field from RF transmit coil unit 206a, and in response thereto produces digital data representing the sensed magnetic resonance signal. RF receive antenna device 206b may include or be attached to one, two, or more receive RF receive coils 206c and may include any kind of other elements to function as a sensor for sensing the magnetic resonance signal emitted from patient 20. Although FIG. 2 shows only one RF receive antenna device 206b, four, eight, 16, 32 or any other desired number of RF receive antenna devices 206b may be employed in different embodiments of MRI system 200. Each RF receive antenna device 206b may be configured to be positioned adjacent to an area of interest of patient 20 and to receive during an RF receive cycle a magnetic resonance signal from the area of interest of patient 20 which is generated in response to the transmit RF magnetic field from RF transmit coil unit 206a.

Clock generator 208 (also referred to herein as a main clock or first clock) generates a first clock signal having a predetermined frequency. Clock generator 208 may be used as a system clock serving as a reference for the timing of the overall operation of MRI system 200.

RF/gradient fields controller 209 changes the gradient magnetic fields in accordance with a required pulse sequence under the control of main controller 224, and controls gradient power supply 203 and transmitter 207 so that the RF pulse may be transmitted. In addition, RF/gradient fields controller 209 is provided with the first clock signal after the level of this signal has been properly adjusted by driver 210. RF/gradient fields controller 209 carries out the pulse sequence synchronously with this first clock signal.

Reconstruction front end 215 receives the magnetic resonance signal 250 provided from RF receive antenna device 206b.

Reconstruction system 220 reconstructs an image of patient 20 on the basis of at least one of the magnetic resonance signals processed in reconstruction front end 215.

Storage device 221 stores various kinds of data such as image data indicating the image reconstructed in reconstruction system 220.

Display 222 displays the image reconstructed in the reconstruction system 220 or various kinds of information including various kinds of operation screens for a user to operate MRI system 200, under the control of main controller 224. Any convenient display device, such as a liquid crystal display, can be used as display 22.

Input unit 223 accepts various commands and information inputs from an operator of MRI system 200. Input unit 223 may include a pointing device such as a mouse or a track ball, a selecting device such as a mode changeover switch, and/or an input device such as a keyboard.

Main controller 224 (which may also be referred to as the MRI system controller) has a CPU, a memory, etc. that are not shown, and controls the whole MRI system 200.

The RF/gradient fields controller 209 and the main controller 224 are tangible and non-transitory. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. The RF/gradient fields controller 209 and the main controller 224 of the present teachings is an article of manufacture and/or a machine component.

The RF/gradient fields controller 209 and the main controller 224 are configured to execute software instructions stored in the storage device 221 to perform functions as described in the various embodiments herein. The RF/gradient fields controller 209 and the main controller 224 may each be a general-purpose processor or may be part of an application specific integrated circuit (ASIC). The RF/gradient fields controller 209 and the main controller 224 may also be (or include) a processor, a microprocessor, a microcomputer, a processor chip, a controller, a microcontroller, a digital signal processor (DSP), a state machine, or a programmable logic device. The RF/gradient fields controller 209 and the main controller 224 may also be (or include) a logical circuit, including a programmable gate array (PGA) such as a FPGA, or another type of circuit that includes discrete gate and/or transistor logic. The main controller 224 may be (or include) a central processing unit (CPU), a graphics processing unit (GPU), or both. Additionally, the RF/gradient fields controller 209 and the main controller 224 may each comprise multiple processors, parallel processors, or both. Multiple processors may be included in, or coupled to, a single device or multiple devices.

The storage device 221 may comprise a main memory, a static memory, or both, where the memories may communicate with each other via a bus (not shown). The storage device 221 described herein are tangible storage mediums that can store data and executable instructions, and are non-transitory during the time instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time.

The storage device 221 of the present teachings is an article of manufacture and/or machine component. The storage device 221 includes one or more computer-readable mediums from which data and executable instructions (e.g., to carry out the processes described in connections with FIG. 4) can be read by a computer. Memories as described herein may be random access memory (RAM), read only memory (ROM), flash memory, electrically programmable read only memory (EPROM), electrically erasable programmable read-only memory (EEPROM), registers, a hard disk, a removable disk, tape, compact disk read only memory (CD-ROM), digital versatile disk (DVD), floppy disk, Blu-ray disk, or any other form of storage medium known to one of ordinary skill in the art. Memories of the present teachings may be volatile or non-volatile, secure and/or encrypted, unsecure and/or unencrypted. The main controller 224, the storage device 221 and the display 222 may be housed within or linked to a workstation (not shown) such as a computer or another assembly of one or more computing devices, a display/monitor, and one or more input devices (e.g., a keyboard, joysticks and mouse) in the form of a standalone computing system, a desktop or a tablet, for example.

The storage device 221 stores instructions that are executed by the RF/gradient fields controller, or the main controller 224, or both, to implement aspects of methods described herein. For example, the main controller 224 or the RF/gradient fields controller 209, or both, may apply instructions to carry out the illustrative method 800 of operating an MRI system described more fully below.

The general operation of an MRI system is well known and therefore a further description thereof will not be repeated here.

As discussed above, RF receive coil(s) 206c operate in an environment of high-magnitude transmit RF magnetic fields, commonly referred to as the $B_1$ field. These fields naturally induce currents into RF receive coil(s) 206c, and if these currents are not controlled they may distort the homogeneity of the $B_1$ field. Furthermore, high-intensity local magnetic fields produced from these induced currents may harm patient 20.

One way to prevent these currents, and maintain safe conditions, involves the use of a switchable high-impedance resonant circuit, or "decoupler," or "trap" placed in series with the loop path. For example, an LC tank circuit may be comprised of two parallel circuit legs such that the capacitor (or inductor) forms one parallel path and the series combination of a switching device, such as a PIN diode, and an inductor (or capacitor) forms the other. The PIN diode may be turned "on" by a direct (DC) current and turned "off" by its removal. Additionally, the PIN diode can be driven into conduction without a DC current, at all, if the imposed RF signal is large enough.

Decouplers are simple, robust circuits, but given the critical nature of their function the MR coil could be rendered unsafe should one fail.

A number of options are available to provide a "failsafe" in case a decoupler fails. One option for such a "failsafe" mechanism takes the form of a monitoring circuit, which measures the DC switching current flowing to the decoupler. Should this current be interrupted, the MRI system controller may be prompted to abort scanning, and/or to notify the operator before harm to the patient can occur. Unfortunately, this method of monitoring is indirect, and cases can arise in which a monitoring circuit can detect a fault that has not created an unsafe condition. Alternatively, and more critically, a failure in the decoupler may occur that is not directly detectable by the monitoring circuit. Because of this, secondary safety mechanisms may be used to create redundant failsafes.

However, the present inventors have appreciated that a better method would be to measure the loop current directly and notify the MRI system controller and/or operator when induced currents exceed safe limits. In the past this would have been difficult to do because of the architecture of MR receive antenna devices, which are designed only to measure current (or voltage) during the receive portion of the RF cycle when signal strengths are orders of magnitude lower than during the transmit portion of the RF cycle. During the RF transmit cycle, preamps and measurement circuits are more often placed into a protected mode, or turned off completely, to prevent damage.

However, as disclosed in more detail below, a system capable of sampling the signal arising from the entire MR cycle can measure the safety conditions of an RF antenna receive device directly, allowing determination of an unsafe condition to be made immediately.

Figure 3:
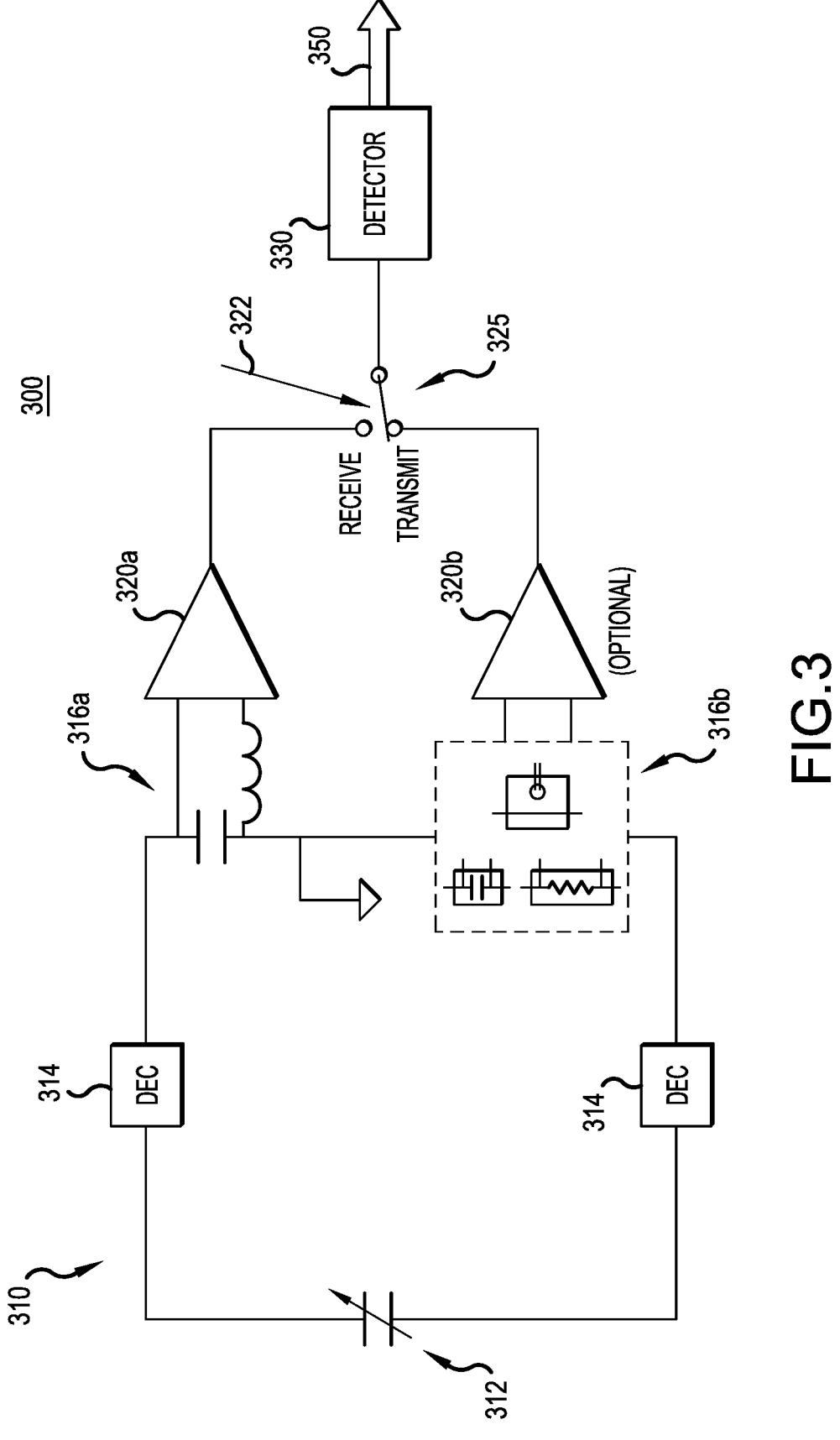
FIG. 3 illustrates a first embodiment of an RF receive antenna device.

FIG. 3 illustrates a first embodiment of an RF receive antenna device 300 which may employ one or more of these principles.

RF receive antenna device 300 includes RF receive coil or loop 310, tuning capacitor 312, one or more decouplers 314, a coupling circuit 316a, a sampling device 316b, a first amplifier (e.g., a preamplifier) 320a, an optional second amplifier (e.g., preamplifier) 320b, a switching device 325, and a detector 330. Notably, and as shown in FIG. 3, the sampling device 316b may be one of a sampling resistance, a sampling capacitance, or a sampling inductance. Moreover, the detector 330 may comprise an analog-to-digital converter (ADC), or alternatively may be an analog detector known to one of ordinary skill in the art. Just by way of example the analog detector may be an analog RF power detector.

Although FIG. 3 shows an example embodiment with a single RF receive coil 310 configured in a single loop, in other embodiments two or more RF receive coils or loops may be provided; for example two or more RF receive coils or loops may be connected in parallel with each other.

Here coupling circuit 316a comprises an LC matching circuit which attempts to couple coil 310 to the input impedance of first preamplifier 320a. Switching device 325 can comprise a transistor or diode or other convenient switching element and operates under control of a switching control signal 322, which for example may be supplied by a processor, such as the main controller 224. Switching control signal 322 may be synchronized to the RF transmit cycles and RF receive cycles of the MRI system.

During the RF transmit cycle, the current flowing through RF receive coil 310 induces a voltage across sampling device 316b, which is supplied as a sampling signal to second preamplifier 320b. Meanwhile, switching device 325 is controlled by switching control signal 322 to connect the output of second preamplifier 320b to the input of detector 330 during the RF transmit cycle. By switching the input signal to detector 330 to second preamplifier 320b during the RF transmit cycle, the current through RF receive coil 310 during the RF transmit cycle can be measured directly and, optionally, converted to a digital word or value by detector 330, which may be, therefore, an analog-to-digital converter (ADC). In RF receive antenna device 300, sampling device 316b can be viewed as a first coupling device for coupling to an input of detector 330 a signal which is proportional to the current flowing through RF receive coil 310 during the RF transmit cycle.

Detector 330 has an output coupled to a processor of the MRI system (e.g., the MRI system controller) for providing to the processor a signal 350, which indicates or represents the magnitude of the current flowing through RF receive coil 310 during the RF transmit cycle. As noted above, the detector 330 may comprise an ADC, in which case, the signal 350 is a digital signal, indicative of or representative of the magnitude of the current flowing through RF receive coil 310 during the RF transmit cycle. Alternatively, the detector 330 may comprise an analog RF power detector. In this case, the signal 350 may still be considered to be digital, but with a reduced bit depth. Accordingly, the main controller 224 may compare a value of signal 350 (e.g., the value of a digital word of signal 350, or the magnitude of the signal 350) to a threshold value which has been established by the designer or operator of the MRI system as representing a maximum allowed magnitude of the current flowing through RF receive coil 310 during the RF transmit cycle, for safety or other reasons. In that case, when the value of signal 350 exceeds the threshold, then the processor (e.g., the MRI system controller) may abort MR scanning, and/or notify a system operator before harm can occur to the subject or patient.

Furthermore, during the RF receive cycle, coupling circuit 316a couples a signal to the input of first preamplifier 320a which is proportional to the current flowing through RF receive coil 310 during the RF receive cycle. Meanwhile, switching device 325 connects the output of first preamplifier 320a to the input of detector 330 during the RF receive cycle. By switching the input signal to detector 330 to first preamplifier 320a during the RF receive cycle, the current through RF receive coil 310 during the RF receive cycle can be measured directly and converted to a digital word or value by detector 330, and provided to a reconstruction system, for example, for producing MR images of an area of interest in the subject or patient.

In some variations of RF receive antenna device 300, second preamplifier 320b may be omitted.

Figure 4:
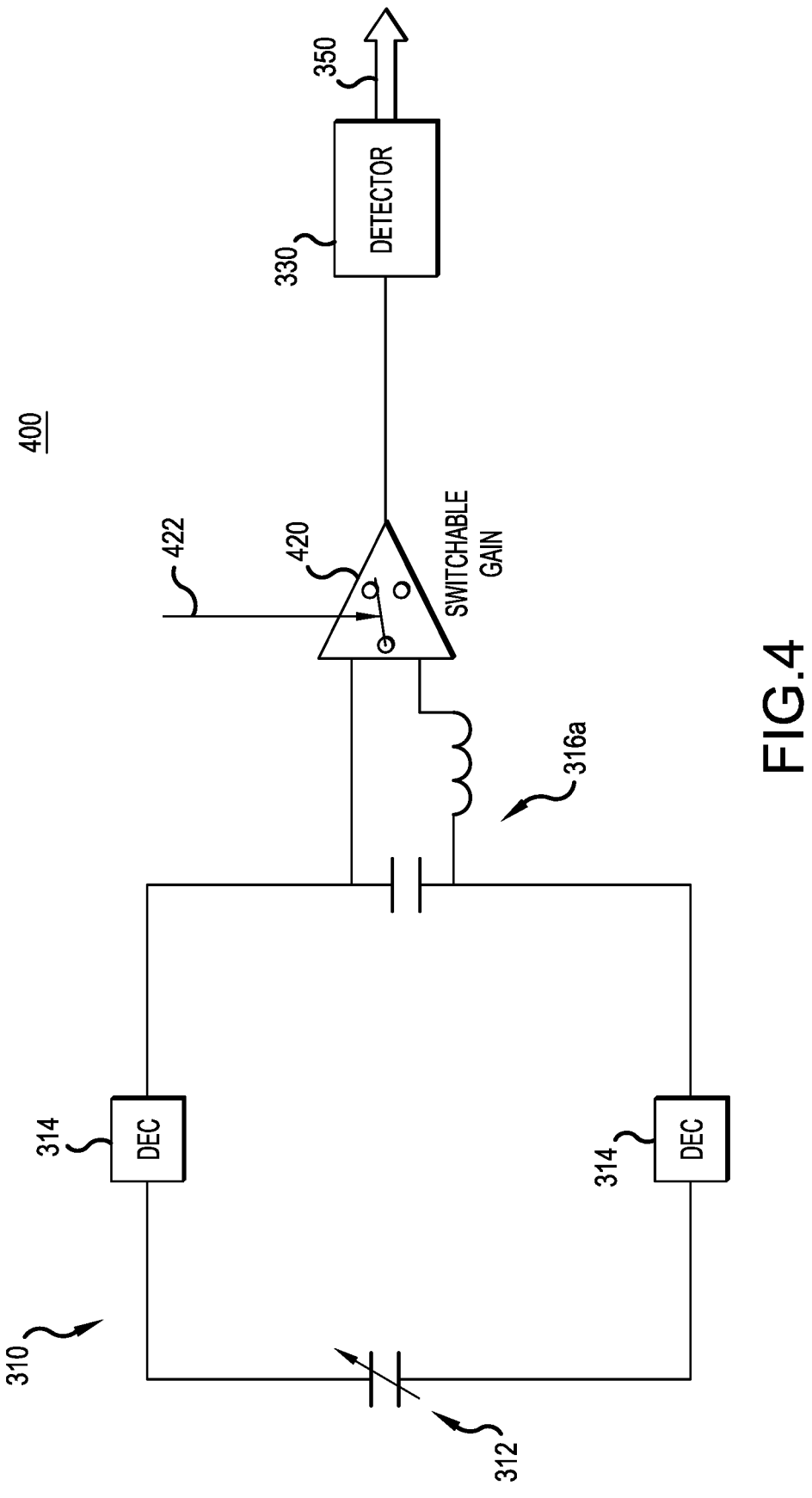
FIG. 4 illustrates a second embodiment of an RF receive antenna device.

FIG. 4 illustrates a second embodiment of an RF receive antenna device 400.

RF receive antenna device 400 is similar in part to RF receive antenna device 300, and so for brevity only the differences therebetween will be discussed and explained here.

In lieu of first preamplifier 320a, second preamplifier 320b, and switching device 325, RF receive antenna device 400 includes a single amplifier (e.g., a preamplifier) 420 which has a switchable gain under control of a switching control signal 422. In particular, preamplifier 420 is switchable between at least a first gain and a second gain which is greater than the first gain, under control of switching control signal 422 which for example may be supplied by a processor, such as the MRI system controller. More specifically, switching control signal 422 may control preamplifier 420 to have a first gain during the RF transmit cycle, and to have a second gain during the RF receive cycle, wherein the second gain is greater than the first gain.

RF receive antenna device 400 retains the existing base architecture of RF receive antenna device in which RF receive coil 310 is interfaced to preamplifier 420 through coupling circuit 316a (an LC matching circuit). The impedance of such a circuit can easily be characterized such that measuring the voltage across the circuit allows one to directly calculate the current in RF receive coil 310 from the signal 350 output by detector 330.

Preamplifier 420 has at least two gain states, as a practical matter, such that the signal seen at the input of detector 330 would be appropriately scaled to prevent overflow. However, at least in theory, and as the cost and capabilities of appropriate preamplifiers and detectors continue to improve, it is conceived that preamplifier 420 with a switchable gain may be replaced with an amplifier (e.g., a preamplifier) whose gain does not need to be switched between RF transmit cycles and RF receive cycles.

Figure 5:
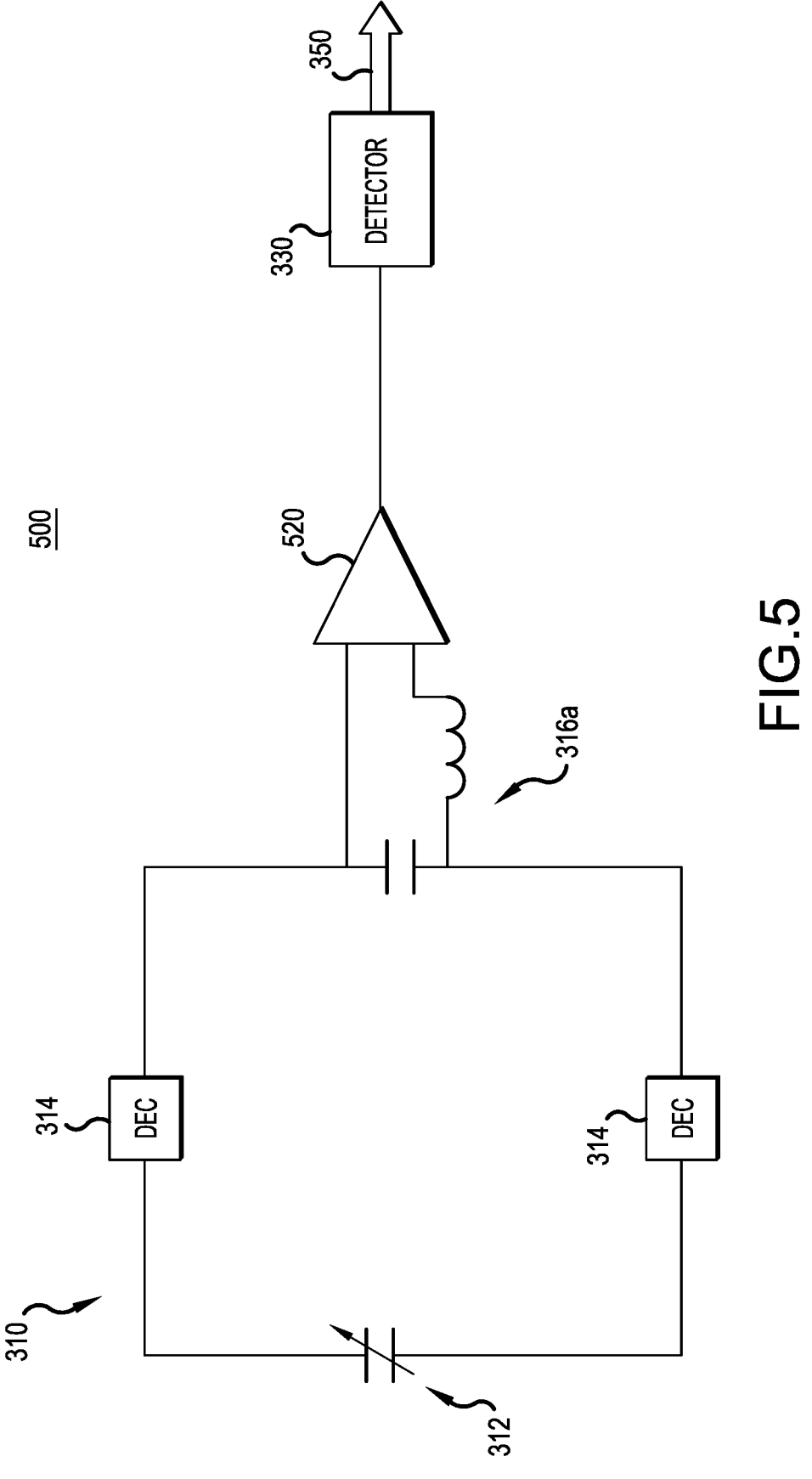
FIG. 5 illustrates a third embodiment of an RF receive antenna device.

FIG. 5 illustrates a third embodiment of an RF receive antenna device 500 which includes such a preamplifier 520. RF receive antenna device 500 is otherwise identical to RF receive antenna device 400, and so for brevity a repeated description will not be made.

Figure 6:
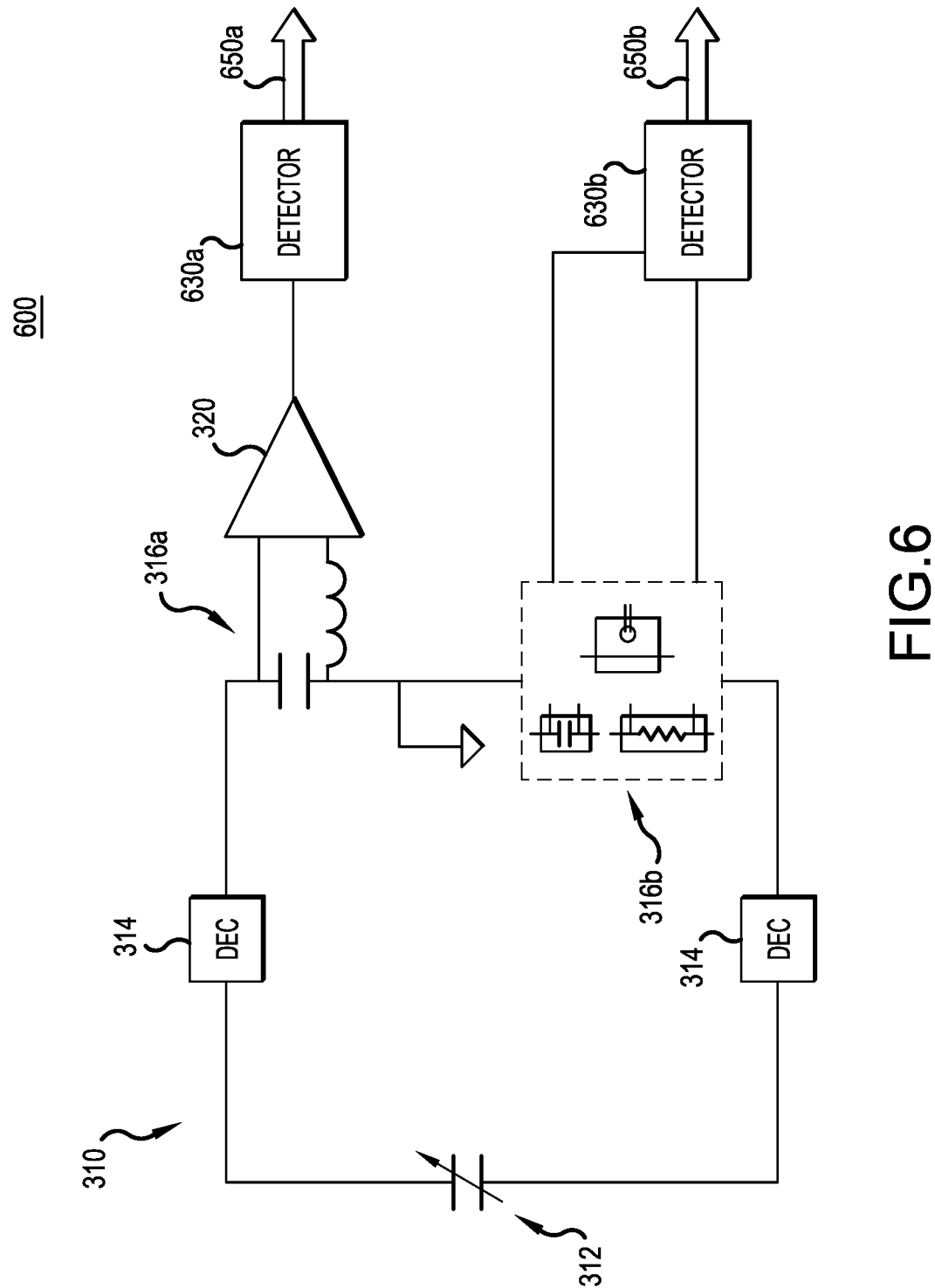
FIG. 6 illustrates a fourth embodiment of an RF receive antenna device.

FIG. 6 illustrates a fourth embodiment of an RF receive antenna device 600.

RF receive antenna device 600 is similar in part to RF receive antenna device 300, and so for brevity only the differences therebetween will be discussed and explained in detail.

RF receive antenna device 600 employs a single amplifier (e.g., a preamplifier) 320, first detector 630a and second detector 630b.

Second detector 630b directly samples the voltage across sampling device 316b at least during the RF transmit cycle and in response thereto outputs first digital signal 650b which indicates or represents the magnitude of the current passing through RF receive coil 310 during the RF receive cycle. second detector 630b provides first digital signal 650b, indicates or represents the magnitude of the current flowing through RF receive coil 310 during the RF transmit cycle to a processor (e.g., the MRI system controller). Accordingly, the processor may compare a value of first digital signal 650b (e.g., the value of a digital word of first digital signal 650b) to a threshold value which has been established by the designer or operator of the MRI system as representing a maximum allowed magnitude of the current flowing through RF receive coil 310 during the RF transmit cycle, for safety or other reasons. In that case, when the value of first digital signal 650b exceeds the threshold, then the processor (e.g., the MRI system controller) may abort MR scanning, and/or notify a system operator before harm can occur to the subject or patient.

Meanwhile, as before, coupling circuit 316a couples a signal to the input of preamplifier 320 which is proportional to the current flowing through RF receive coil 310 during the RF receive cycle. Accordingly, the current through RF receive coil 310 during the RF receive cycle can be measured directly and converted to a digital word or value by first detector 630a, and provided via a second digital signal 650a to a reconstruction system, for example, for producing MR images of an area of interest in the subject or patient.

Matching the specifications of first detector 630a, which is employed for the RF receive cycles to generate MR imaging data from the current in RF receive coil 310, could result in second detector 630b being quite costly. However, measurement of the current in RF receive coil 310 for safety purposes would not require an detector with the same bit depth, or perhaps even the same sampling rate, which would be required for sampling the MR imaging signal from the patient obtained via RF receive coil 310 in the RF receive cycle. In that case, a lower performance and less expensive device, with fewer bits and/or a lower sampling rate, may be employed for second detector 630b, thereby reducing the cost of RF receive antenna device 600.

The embodiments described above with respect to FIGS. 3 through 6 are not intended to be exclusive or limiting, but instead are intended to be illustrative examples of RF receive antenna devices which directly sample and measure the current through RF receive coil 310, and generate a digital representation thereof, at least during the RF transmit cycle. This digital representation may be provided to a processor (e.g., the MRI system controller) for aborting MR scanning, and/or notifying a system operator, before harm can occur to the subject or patient due to excessive current in RF receive coil 310 during the RF transmit cycle (for example, due to a fault or malfunction of decoupler(s) 314). Direct measurement of the current may also reduce or eliminate the possibility of false detection of a fault in a decoupler 314 which has not in fact created an unsafe condition. This consequentially may improve the reliability of the RF receive antenna device.

Once the current through RF receive coil 310 is directly measured, sampled, and digitized, and that digital signal processed, then the current through RF receive coil 310 may be advantageously controlled in amplitude and phase such that the current through RF receive coil 310 is allowed to distort the $B_1$ field in a known and controlled manner. Alternatively, the current through the RF receive coil 310 can be measured by second detector 630*b*, and its output be used to control the amplitude and phase.

Manipulating the transmit field in this way may be referred to as $B_1$ "shimming" and this technique may be effective in localizing RF excitation of tissue to reduce the specific absorption rate (SAR), to counteract the localized image intensity shading effects caused by the natural conductivity of the human body, and/or to create RF phase gradients from RF receive coil 310 for the purpose of spatial encoding, or general altered k-space trajectories.

Once the current induced in RF receive coil 310 is measured directly, modulation of that current can be achieved by adding a controllable variable impedance element in the series path of RF receive coil 310. The impedance of the controllable variable impedance element can be controlled using a local processing device or circuit in the RF receive antenna device itself. Alternatively, in some embodiments control could also be handled by the MRI system (e.g., the MRI system controller), rather than locally in the RF receive antenna device, as long as the proper connection infrastructure is available.

Figure 7:
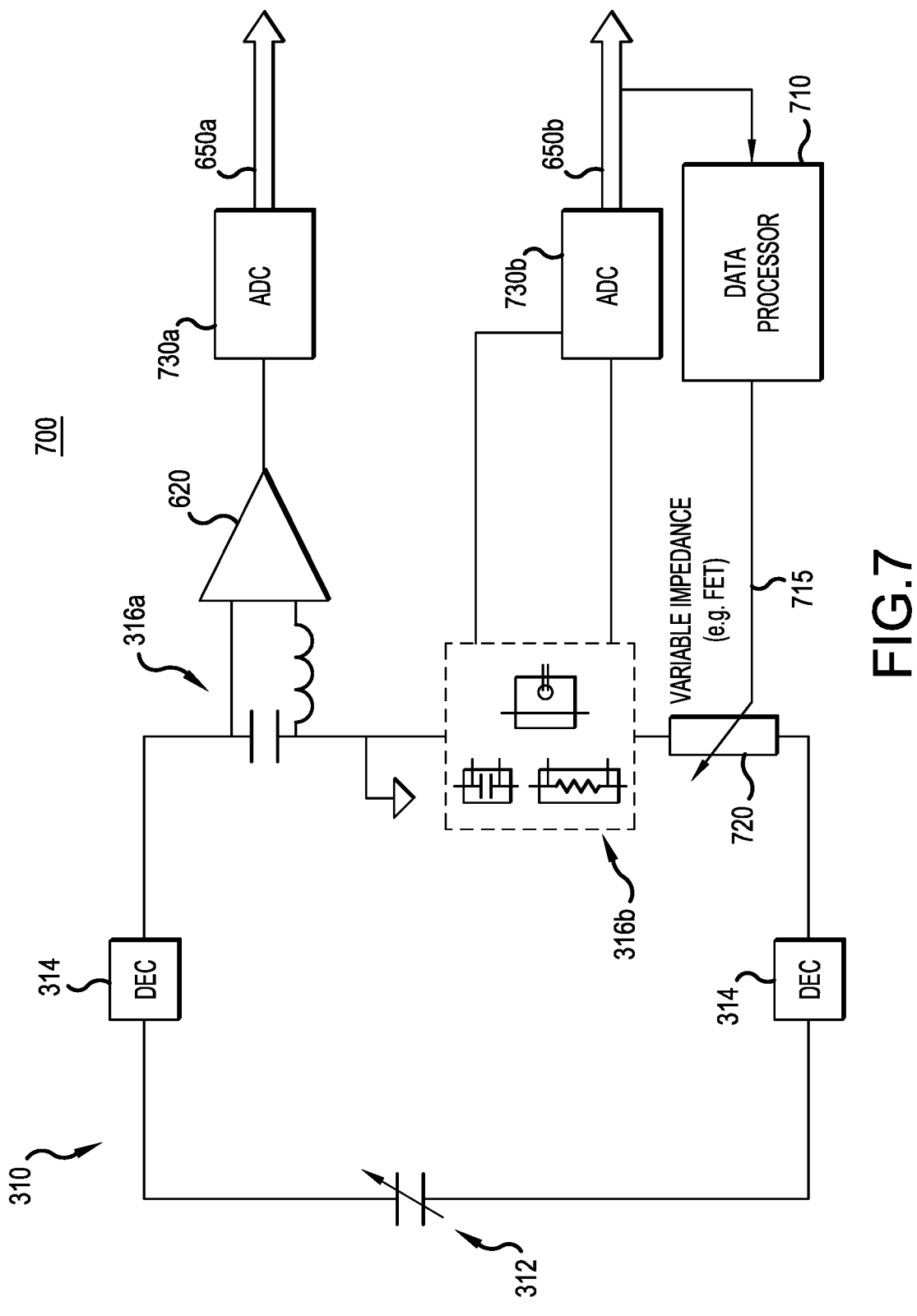
FIG. 7 illustrates a fifth embodiment of an RF receive antenna device.

Toward this end, FIG. 7 illustrates a fifth embodiment of an RF receive antenna device 700.

RF receive antenna device 700 is similar in part to RF receive antenna device 600, and so for brevity only the differences therebetween will be discussed and explained here.

RF receive antenna device 700 includes a data processor or data processing circuit 710 which is connected to the output of second ADC 730*b* and is configured to receive first digital signal 650*b* which indicates the magnitude of the current flowing through RF receive coil 301 during the RF transmit cycle. RF receive antenna device 700 also includes a controllable variable impedance element 720 which is connected in the series path of RF receive coil 310. In various embodiments, controllable variable impedance element 720 may comprise a field effect transistor (FET) placed across a gap in RF receive coil 310, controlled at the gate by a voltage produced by a digital-to-analog converter (DAC) of data processing circuit 710 in response to first digital signal 650*b*. Controllable variable impedance element 720 may be controlled by a control signal 715 from data processing circuit 710 to have a very low impedance during the RF receive cycle. Furthermore, controllable variable impedance element 720 may be controlled by data processing circuit 710 to have any desired impedance during the RF transmit cycle so as to control the amplitude and phase of the current through RF receive coil 310 in order to distort the $B_1$ field in a known and controlled manner, as discussed above ($B_1$ "shimming"). As also mentioned above, this may be effective in localizing RF excitation of tissue to reduce the specific absorption rate (SAR), to counteract the localized image intensity shading effects caused by the natural conductivity of the human body, and/or to create RF phase gradients from RF receive coil 310 for the purpose of spatial encoding, or general altered k-space trajectories.

Although the additional processing circuit and controllable variable impedance element to provide these possibilities are shown in FIG. 7 as having been added to RF receive antenna device 600 of FIG. 6, in principle similar elements may be added to RF receive antenna device 300 of FIG. 3, RF receive antenna device 400 of FIG. 4, or RF receive antenna device 500 of FIG. 5 to achieve similar benefits.

Furthermore, although FIG. 7 only shows controllable variable impedance element 720 being controlled by data processing circuit 710 in response to first digital signal 650*b* from second ADC 730*b*, many variations are contemplated. In some variations, data processing circuit 710 also receives second digital signal 650*a* from first ADC 730*a*, and controls controllable variable impedance element 720 in response to both first digital signal 650*b* and second digital signal 650*a*. In that case, the control of controllable variable impedance element 720 may depend upon information gathered from both the transmit RF cycles and the receive RF cycles. In other variations, data processing circuit 710 may be omitted, and the control signal 715 for controllable variable impedance element 720 may be provided instead by a processor of the MRI system (e.g., the MRI system controller), in response to first digital signal 650*b* (and optionally also second digital signal 650*a*). Again, many variations are contemplated.

FIG. 8 illustrates an example embodiment of a method 800 of operating an MRI system, such as MRI system 100 or 200, which includes an RF receive antenna device, such as RF receive antenna device 300, 400, 500, 600 or 700, which can directly sample, measure, and digitize the current though an RF receive coil during an RF transmit cycle. Moreover, and as alluded to above, the method 800 may be stored in storage device 221 as instructions that are executed by the RF/gradient fields controller 209, or the main controller 224, or both, to implement aspects of methods described herein.

An operation 810 includes producing a magnetic field with the MRI system.

An operation 820 includes applying an RF transmit signal to at least a portion of a patient or subject who is being imaged, and perturbing an alignment of the magnetization with respect to the magnetic field.

An operation 830 includes sensing with an RF receive antenna device, during an RF receive cycle, a magnetic resonance (MR) signal emitted from the patient in response to the transmit RF magnetic field. Here, the RF receive antenna unit includes at least one RF receive coil. In some embodiments, the RF receive antenna device may be RF receive antenna device 300, 400, 500, 600, 700, or a variant thereof.

An operation 840 includes coupling to an input of a detector (or analog or digital) of the RF receive antenna device a first signal, which is proportional to a current flowing through the at least one RF receive coil during at least the RF transmit cycle. Some embodiments include coupling the first signal to the input of the detector during the RF receive cycle, too. In other embodiments, separate detectors are provided for measuring the current in the RF receive cycle and in the RF transmit cycle. Many variations are possible, at least some of which have been described above with respect to FIGS. 3-7.

An operation 850 includes outputting from the detector to a processor an analog or digital signal (e.g., signal 350), wherein the signal indicates or represents a magnitude of the current flowing through the at least one RF receive coil during at least the RF transmit cycle. Again, in some embodiments the detector outputs the signal during the RF receive cycle, too. In other embodiments, separate detectors are provided for measuring the current in the RF receive cycle and in the RF transmit cycle.

An operation 860 includes discontinuing the transmit RF magnetic field when the signal indicates that the magnitude of the current flowing through the at least one RF receive coil during the RF transmit cycle is greater than a threshold value. The threshold value may be selected by the designer of an MRI system, or an operator of the MRI system, as representing a maximum allowed magnitude of the current flowing through RF receive coil during the RF transmit cycle, for safety or other reasons.

An operation 870 includes, in response to operation 830 above, generating magnetic resonance images of one or more areas of interest in a patient or subject based at least in part on the digital signal output by the detector during the RF receive cycle.

An operation 880 includes controlling a controllable variable impedance element connected in a series path of the at least one RF receive coil based on the digital signal output by the detector. For example, during the RF receive cycle the controllable variable impedance element may be controlled to have a very low impedance. On the other hand, during the RF transmit cycle, the impedance of the controllable variable impedance element may be selected so as to control the amplitude and phase of the current through the RF receive coil in order to distort the $B_1$ field in a known and controlled manner, as discussed above ($B_1$ "shimming"). As also mentioned above, this may be effective in localizing RF excitation of tissue to reduce the specific absorption rate (SAR), to counteract the localized image intensity shading effects caused by the natural conductivity of the human body, and/or to create RF phase gradients from the RF receive coil for the purpose of spatial encoding, or general altered k-space trajectories.

As explained above with respect to FIG. 7, in some variations where a second is present for measuring the loop current during RF receive cycles, operation 880 may further include controlling the controllable variable impedance element based on a second digital signal output by the second ADC 730b. In that case, the control of the variable impedance element may depend upon information gathered from both the transmit RF cycles and the receive RF cycles. Many variations are contemplated.

It should be understood that the order in which the operations are listed in FIG. 8 is merely an order for describing the operations and is not meant to indicate that the operations are necessarily performed in that order. Many of the operations in fact may be performed at the same time as each other, and many of the operations may be performed repetitively. Indeed it should be understood that, in general, these operations may be continuously performed in a method of gathering magnetic resonance data and ensuring the safe operation of an MRI system. Furthermore, for example, in some embodiments operation 880 may be omitted.

The inventive concepts also encompass a computer readable medium that stores instructions that cause a data processing system (such as the processor 118) to execute the methods described herein. A computer readable medium is defined to be any medium that constitutes patentable subject matter under 35 U.S.C. § 101 and excludes any medium that does not constitute patentable subject matter under 35 U.S.C. § 101. Examples of such media include non-transitory media such as computer memory devices that store information in a format that is readable by a computer or data processing system. More specific examples of non-transitory media are noted above.

Although trend based analyses have been described with reference to several representative embodiments, it is understood that the words that have been used are words of description and illustration, rather than words of limitation. Changes may be made within the purview of the appended claims, as presently stated and as amended, without departing from the scope and spirit of perfusion shift measuring in its aspects. Although perfusion shift measuring has been described with reference to particular means, materials and embodiments, perfusion shift measuring is not intended to be limited to the particulars disclosed; rather perfusion shift measuring extends to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

What is claimed is:

1. A magnetic resonance imaging (MRI) system, comprising:

a magnet configured to produce a magnetic field;

gradient coils configured to at least partially surround at least a portion of a patient which is being imaged;

a radio frequency (RF) transmit coil configured to apply a transmit RF magnetic field during an RF transmit cycle to at least the portion of a patient and to perturb an alignment of the magnetization with respect to the magnetic field in the portion of the patient; and at least one RF receive antenna device configured to be positioned adjacent to an area of interest of the patient and to receive during an RF receive cycle a magnetic resonance signal from the area of interest of the patient which is generated in response to the transmit RF magnetic field, wherein the at least one RF receive antenna device comprises:

at least one RF receive coil array, a detector, and a first coupling device adapted to connect to an input of the detector a first signal, which is proportional to a current flowing through the at least one RF receive coil array during at least the RF transmit cycle, wherein: the MRI system includes a main controller; the detector has an output coupled to the main controller to provide to the main controller the first signal, wherein the first signal indicates a magnitude and/or phase of the current flowing through the at least one RF receive coil array during at least the RF transmit cycle; a second signal is coupled to the input of the detector, the second signal being proportional to a current flowing through the at least one RF receive coil array during the RF receive cycle; a digital signal output by the detector indicates the magnitude and/or phase of the current flowing through the at least one RF receive coil array during the RF receive cycle and during the RF transmit cycle; and a magnetic resonance image of the area of interest is generated by the main controller based at least in part on the digital signal during the RF receive cycle.

2. The MRI system of claim 1, wherein the first coupling device includes:

a first amplifier; and a sampling device for coupling to an input of the first amplifier a sampling signal, which is proportional to the current flowing through the at least one RF receive coil array during at least the RF transmit cycle, wherein an output of the first amplifier is coupled to the input of the detector.

3. The MRI system of claim 2, wherein first coupling device further includes:

a second amplifier;

a coupling circuit for coupling to an input of the second amplifier a second sampling signal which is proportional to a current flowing through the at least one RF receive coil array during the RF receive cycle; and a switching device having a first input terminal connected to the output of the first amplifier, and having a second input terminal connected to an output of the second amplifier, and having an output connected to the input of the detector, wherein the MRI system is configured to control the switching device to connect the output of the first amplifier to the input of the detector during the RF transmit cycle and to connect the output of the second amplifier to the input of the detector during the RF receive cycle, and wherein during the RF receive cycle the digital signal indicates a magnitude and/or phase of the current flowing through the at least one RF receive coil array during the RF receive cycle.

4. The MRI system of claim 3, wherein the sampling device comprises a resistive element, or a capacitive element, or an inductive element connected in series with the at least RF receive one coil array, and wherein the coupling circuit comprises an impedance matching network.

5. The MRI system of claim 3, wherein the coupling circuit is further configured to couple to the input of the detector a third signal, which is proportional to a current flowing through the at least one RF receive coil array during the RF receive cycle, and wherein the first amplifier and the detector each have a sufficient dynamic range such that the third signal indicates the magnitude and/or phase of the current flowing through the at least one RF receive coil array during the RF receive cycle and during the RF transmit cycle.

6. The MRI system of claim 3, wherein the coupling circuit is also configured to couple to the input of the detector a third signal which is proportional to a current flowing through the at least one RF receive coil during the RF receive cycle, wherein the first amplifier has a switchable gain under control of a control signal of the MRI system, wherein the control signal controls the first amplifier to have a first gain during the RF transmit cycle, and to have a second gain during the RF receive cycle, wherein the second gain is greater than the first gain, and wherein the third signal indicates the magnitude and/or phase of the current flowing through the at least one RF receive coil during the RF receive cycle and during the RF transmit cycle.

7. The MRI system of claim 1, wherein the at least one RF receive antenna device further comprises:

a second detector; and a second coupling device adapted to couple to an input of the second detector a second signal, which is proportional to a current flowing through the at least one RF receive coil array during the RF receive cycle, wherein the second detector has an output coupled to the main controller for providing to the main controller a digital signal, wherein the second signal indicates a magnitude and/or phase of the current flowing through the at least one RF receive coil during the RF receive cycle.

8. The MRI system of claim 1, wherein the at least one RF receive antenna device further comprises:

a variable impedance element connected in series with the at least one RF coil array, wherein the variable impedance element is controlled by a control signal; and a data processing circuit having an input connected to the output of the detector and being configured to generate the control signal in response to the output of the detector, wherein the data processing circuit generates the control signal to cause the variable impedance element to have a first impedance during the RF transmit cycle, and to have a second impedance during the RF receive cycle; and wherein the first impedance is greater than the second impedance.

9. A method, comprising:

producing a magnetic field;

during a radio frequency (RF) transmit cycle applying an RF transmit signal to at least a portion of a patient which is being imaged, and perturbing an alignment of the magnetic field;

sensing with an RF receive antenna device having at least one RF receive coil a magnetic resonance signal emitted from an area of interest of the patient during an RF receive cycle in response to the RF transmit signal;

coupling to an input of a detector a first signal which is proportional to a current flowing through the at least one RF receive coil during at least the RF transmit cycle;

outputting from the detector to a processor a digital signal, wherein the digital signal indicates a magnitude and/or phase of the current flowing through the at least one RF receive coil during at least the RF transmit cycle;

discontinuing the RF transmit signal when the digital signal indicates that the magnitude and/or phase of the current flowing through the at least one RF receive coil during the RF transmit cycle is greater than a threshold;

coupling to the input of the detector a second signal which is proportional to a current flowing through the at least one RF receive coil during the RF receive cycle, wherein the digital signal indicates the magnitude and/or phase of the current flowing through the at least one RF receive coil during the RF receive cycle and during the RF transmit cycle; and generating a magnetic resonance image of the area of interest based at least in part on the digital signal during the RF receive cycle.

10. The method of claim 9, further comprising controlling a switch to selectively couple the first signal to the input of the detector during the RF transmit cycle and to selectively couple the second signal to the input of the detector during the RF receive cycle.

11. The method of claim 9, further comprising controlling a variable impedance element connected in series with the at least RF receive one coil array based on the digital signal output by the detector to cause the variable impedance element to have a first impedance during the RF transmit cycle, and to have a second impedance during the RF receive cycle, wherein the first impedance is greater than the second impedance.

12. The method of claim 9, further comprising:

coupling to an input of a second detector a second signal which is proportional to a current flowing through the at least one RF receive coil during the RF receive cycle; and outputting from the second detector to the processor a second digital signal, wherein the second digital signal indicates a magnitude and/or phase of the current flowing through the at least one RF receive coil during the RF receive cycle.

13. A device configured to receive during a radio frequency (RF) receive cycle a magnetic resonance signal from an area of interest of a patient which is generated in response to a RF transmit signal during an RF transmit cycle of a magnetic resonance imaging (MRI) system, the device comprising:

at least one RF receive coil element;

a detector configured to communicate with a main controller of the MRI system; and a first coupling device adapted to couple to an input of the detector a first signal that is proportional to a current flowing through the at least one RF receive coil element during at least the RF transmit cycle, wherein: the detector has an output for providing a signal; the signal indicates a magnitude and/or phase of the current flowing through the at least one RF receive coil element during at least the RF transmit cycle; a second signal is coupled to the input of the detector, the second signal being proportional to a current flowing through the at least one RF receive coil element during the RF receive cycle; a digital signal output by the detector indicates the magnitude and/or phase of the current flowing through the at least one RF receive coil during the RF receive cycle and during the RF transmit cycle; and a magnetic resonance image of the area of interest is generated by the main controller based at least in part on the digital signal during the RF receive cycle.

14. The device of claim 13, wherein the first coupling device includes:

a first amplifier; and a first sampling device adapted to couple to an input of the first amplifier a sampling signal which is proportional to the current flowing through the at least one RF receive coilelement during at least the RF transmit cycle, wherein an output of the first amplifier is coupled to the input of the detector.

15. The device of claim 14, wherein first coupling device further includes:

a second amplifier;

a second sampling device for coupling to an input of the second amplifier a second sampling signal which is proportional to a current flowing through the at least one RF receive coil element during the RF receive cycle; and a switching device having a first input terminal connected to the output of the first amplifier, and having a second input terminal connected to an output of the second amplifier, and having an output connected to the input of the detector, wherein: the switching device is configured to be controlled to connect the output of the first amplifier to the input of the detector during the RF transmit cycle and to connect the output of the second amplifier to the input of the detector during the RF receive cycle, and wherein during the RF receive cycle the digital signal indicates the magnitude and/or phase of the current flowing through the at least one RF receive coil element during the RF receive cycle.

16. The device of claim 14, wherein the first coupling device is also configured to couple to the input of the detector a second signal which is proportional to a current flowing through the at least one RF receive coil element during the RF receive cycle, and wherein the first amplifier and the detector each have a sufficient dynamic range such that the first signal indicates the magnitude and/or phase of the current flowing through the at least one RF receive coil element during the RF receive cycle and during the RF transmit cycle.

17. The device of claim 14, wherein the first coupling device is also configured to couple to the input of the detector the second signal which is proportional to a current flowing through the at least one RF receive coil element during the RF receive cycle, wherein the first amplifier has a switchable gain under control of a control signal, wherein control signal controls the first amplifier to have a first gain during the RF transmit cycle, and to have a second gain during the RF receive cycle, wherein the second gain is greater than the first gain, and wherein the first signal indicates the magnitude and/or phase of the current flowing through the at least one RF receive coil element during the RF receive cycle and during the RF transmit cycle.

18. The device of claim 13, further comprising: a second detector; and a second coupling device for coupling to an input of the second detector a second signal which is proportional to a current flowing through the at least one RF receive coil element during the RF receive cycle, wherein the second detector has an output which is configured to provide a third signal, wherein the third signal indicates a magnitude and/or phase of the current flowing through the at least one RF receive coil element during the RF receive cycle.

19. The device of claim 13, further comprising:

a variable impedance element connected in series with the at least one RF coil element, wherein the variable impedance element is controlled by a control signal; and a data processing circuit having an input connected to the output of the detector and being configured to generate the control signal in response to the output of the detector, wherein the data processing circuit generates the control signal to cause the variable impedance element to have a first impedance during the RF transmit cycle, and to have a second impedance during the RF receive cycle; and wherein the first impedance is greater than the second impedance.

\* \* \* \* \*